United States Patent
Andersson

[11] Patent Number: 6,134,135
[45] Date of Patent: Oct. 17, 2000

[54] MASK ARRANGEMENT FOR SCALABLE CAM/RAM STRUCTURES

[75] Inventor: Per Andersson, Lund, Sweden

[73] Assignee: SwitchCore, A.B., Sweden

[21] Appl. No.: 09/480,827

[22] Filed: Jan. 10, 2000

[51] Int. Cl.⁷ .................................................. G11C 15/00
[52] U.S. Cl. ........................................... 365/49; 395/425
[58] Field of Search .............................. 365/49; 395/425, 395/435

[56] References Cited

U.S. PATENT DOCUMENTS

| | | | |
|---|---|---|---|
| 5,051,949 | 9/1991 | Young | 365/49 |
| 5,383,146 | 1/1995 | Threewitt | 365/49 |
| 5,386,413 | 1/1995 | McAuley et al. | 370/54 |
| 5,440,715 | 8/1995 | Wyland | 395/435 |
| 5,467,349 | 11/1995 | Huey et al. | 370/60.1 |
| 5,642,114 | 6/1997 | Komoto et al. | 365/49 |
| 5,706,224 | 1/1998 | Srinivasan et al. | 365/49 |

FOREIGN PATENT DOCUMENTS

| | | | |
|---|---|---|---|
| 0 612 154 | 2/1993 | European Pat. Off. . | |
| 0 650 167 A2 | 10/1993 | European Pat. Off. . | |
| 0612154 A1 | 2/1994 | European Pat. Off. | H03K 19/177 |
| 0650167 A2 | 10/1994 | European Pat. Off. | G11C 15/00 |
| 0 883 132 | 5/1997 | European Pat. Off. . | |
| 0993132 A2 | 4/1998 | European Pat. Off. | G11C 16/00 |
| 2 755 531 | 3/1987 | France . | |
| 2755531 | 3/1987 | France | G11C 15/04 |
| 07/288541 | 4/1994 | Japan . | |
| 08/115262 | 10/1994 | Japan . | |
| 07-288541 | 10/1995 | Japan | H04L 12/46 |
| 08-115262 | 5/1996 | Japan | G06F 12/10 |
| 10/070573 | 8/1996 | Japan . | |
| 10/223778 | 2/1997 | Japan . | |
| 10-070573 | 3/1998 | Japan | H04L 12/56 |
| 10-233778 | 9/1998 | Japan | G06F 13/00 |

*Primary Examiner*—Vu A. Le
*Attorney, Agent, or Firm*—Coudert Brothers

[57] ABSTRACT

The invention relates to a CAM/RAM memory device with a scalable and flexible structure. The device has a number of rows of memory cells. At least one address decoder is connected by word lines to the cells of the rows. Vertical bit lines for match data implement CAM functionality of the memory device. According to the invention a mask is implemented in a row of the memory cells, the mask affecting the match data on the bit lines. Preferably, the memory device is divided into segments with a mask at the top of each segment. By means of the present invention, masking is obtained by inserting masks as mask rows between the CAM rows. The mask rows are programmed by writing the mask row cells in the same way as the CAM cells. The mask rows operate directly on the bit lines for the whole underlying segment of rows. By means of this arrangement, the invention makes efficient use of the available silicon area. The memory device has a useful application as a device for handling address look-up, e.g. in a switch or router.

15 Claims, 3 Drawing Sheets

MASK ARRANGEMENT FOR SCALABLE CAM/RAM STRUCTURES

FIELD OF INVENTION

The present invention relates to a CAM/RAM memory device with a scalable and flexible structure. CAM/RAM in this document means that the memory device functions both as a CAM (Content Addressable Memory) with matching operations and also has all ordinary RAM (Random Access Memory) functionality, i.e. a memory device with a CAM match operation mode and a RAM addressed read mode, where selectable parts of the memory cells can be masked off for the CAM mode and reading and writing may be performed directly through an address decoder in the RAM addressed read mode.

By means of the present invention masking is obtained by inserting masks as mask rows between the CAM rows. The mask rows are programmed by writing the mask row cells in the same way as the CAM cells. The mask rows operate directly on the bit lines for the whole underlying segment of rows. CAM/RAM memory devices are especially useful, but not limited to, address look-up devices. The memory device may employ a block structure for an efficient use of the silicon area. Blocks are arranged in parallel with common word lines running through all the blocks and operative in both RAM read/write and CAM look-up.

STATE OF THE ART

CAM memories are attractive for use in address look-up devices, and there are many different implementations of doing so. A general structure contains a CAM memory where selectable parts can be masked off to implement different look-up schemes and get the ability to handle hierarchical addresses. To get an efficient handling of address learning and changes of the look-up table it is also desirable to have a CAM that in parts works as an ordinary RAM. For address flexibility it is also desirable to have the partitions into CAM and pure RAM configurable. There exists a number of different ways of achieving these memories and examples include those described in e.g. U.S. Pat. No. 5,383,146 (Threewitt) and U.S. Pat. No. 5,706,224 (Srinvasan et al.).

When using a CAM/RAM structure as a part of an integrated device, the form factor and size are very important parameters. This is the case of a pure CAM chip as well but more so in the case of integration into single chip devices. This is important to consider when deciding how to implement the masks desired for masking out bits not to be taken into account in the match operations. The common way of implementing the masks are either to have separate mask registers as in the above U.S. patents, or to implement a mask into each memory row. Implementing a mask into each memory row (so called ternary CAM cells) is really not desirable for these kinds of area sensitive implementations, unless the application itself demands a mask for every row, since it increases the size of all CAM cells. The implementation with mask registers on the other hand requires extra logic and addressing for writing to these registers, and it is also not suitable for implementing more than a few mask rows. So, the problem is to find a way of efficiently implementing a structure where a rather small subset of the memory array shares a mask, e.g. for every 15 CAM rows there is one mask row.

The present invention solves the problem of enabling flexible and area-efficient mask implementations by inserting the masks between CAM rows in the memory array and masking the data in the bit lines. This gives a more flexible structure than the common way of placing the mask register and masking function before match data affects the bit lines as shown in FIG. 1. This also allows fine granularity and efficient integration into the memory array. Also, since no change is made to the CAM cells, these do not suffer from increased area.

By implementing a number of the memory rows as mask rows only, instead of CAM rows, it is possible to address these in the same way, and with the same address decoder as the rest of the memory. It gives a flexible way of implementing different mask granularities for different CAM implementations when designing a system.

SUMMARY OF THE INVENTION

The present invention provides a CAM/RAM memory device with a scalable structure comprising a memory having a number of rows of memory cells. At least one address decoder is connected by word lines to the cells of the rows. Vertical bit lines for match data implement CAM functionality of the memory device.

According to the invention a mask is implemented in a row of the memory cells, the mask affecting the match data on the bit lines.

In a preferred embodiment, the memory device is divided into segments with a mask row at the top of each segment.

The scope of the invention is defined in the accompanying claims.

By means of this arrangement, the invention makes efficient use of the available silicon area. Also, the memory device is flexible since all the memory cells may be handled directly in RAM mode for reading and writing. Thus, the data structure is easily changed including the mask data of the CAM functionality. The memory device has a very useful application as a device for handling address lookup, e.g. in a switch or router.

BRIEF DESCRIPTION OF THE DRAWINGS

The invention will be described in detail below with reference to the accompanying drawings, of which.

DETAILED DESCRIPTION OF PREFERRED EMBODIMENTS

When using these CAM/RAM structures as parts of a custom integrated single chip device, it is important that the structure is flexible both in terms of configurability and physical form factor. The intention of the invention is to enable a more flexible partitioning of the complete structure for this kind of memory.

Figure 1:
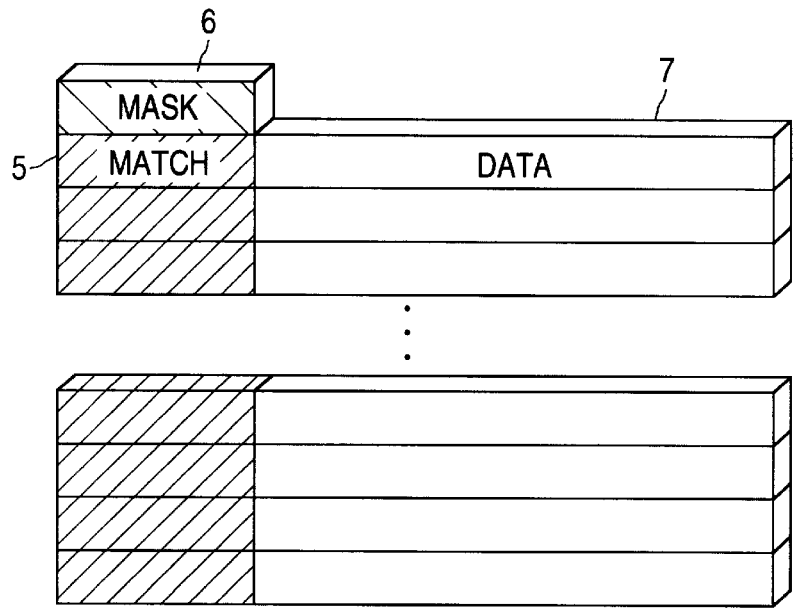
FIG. 1 is a diagram of the prior art CAM/RAM structure.

The basic CAM/RAM structure according to the prior art is shown in FIG. 1. Input data is compared with the contents of the match field 5 and bits not to be considered in the comparison are defined in the mask 6. The data to be retrieved is stored in the data field 7. FIG. 1 illustrates one example of the prior art in which the mask is stored in a separate register and applied to the match data before the match data is applied to the CAM memory. As mentioned in the introduction, an alternative (not shown) is to implement a mask in each row of the CAM memory.

The additions needed for handling different types of address look-ups are to have a dynamically changeable configuration of the sizes of the CAM and RAM parts, respectively. In the case of IP address look-up there are a number of different address types to have support for, such as CIDR, MAC, IP-multi and VLAN. The distribution between these different types is not known in advance since it depends on the kind of device the chip is used in, and on the environment in which this device is used. The size of the necessary memory is on the other hand not that dependent on which type of address types it has to handle. A certain size of switch needs a certain amount of address memory depending on the amount of traffic it is able to handle, but this traffic can demand any of the address types, maybe all, maybe just one, but the amount is fairly stable. Therefore it is important that this partitioning of the memory can be made dynamically and in rather fine granularity.

Figure 2:
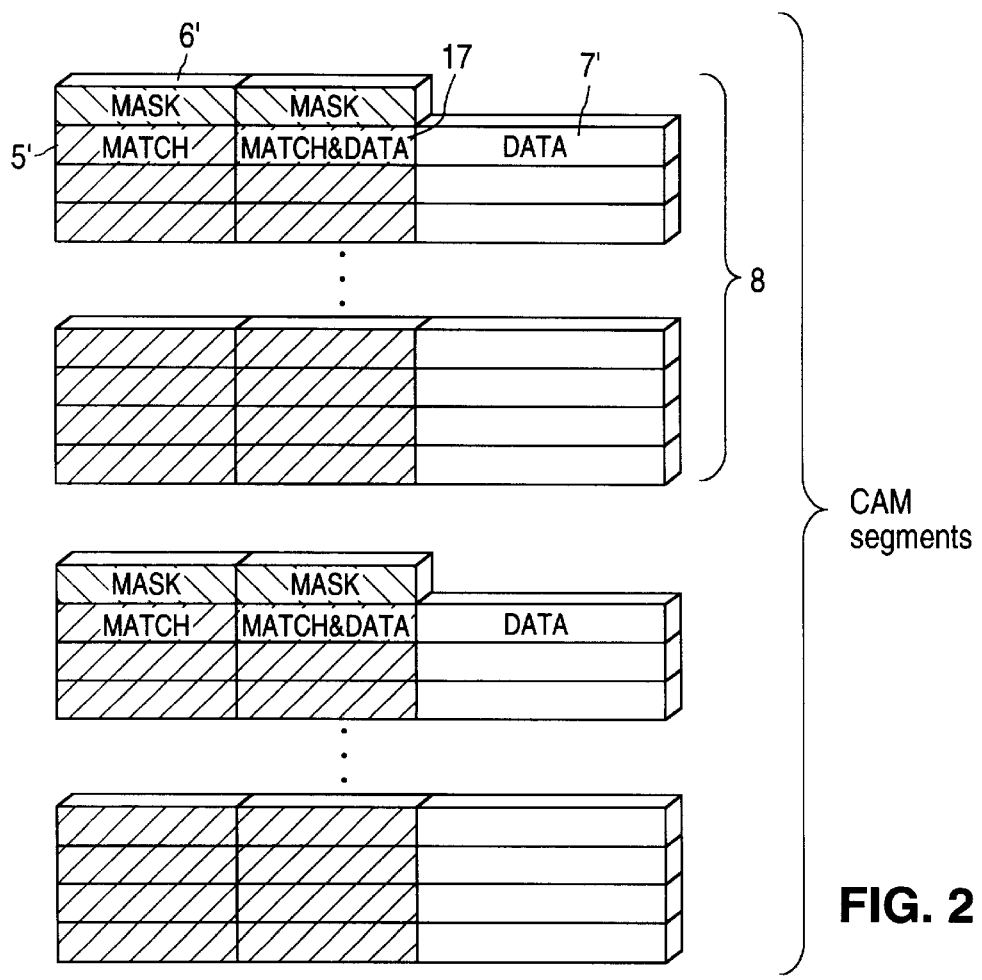
FIG. 2 is a diagram of the CAM/RAM segmented structure according to the invention.

The granularity chosen in this example is 16 word blocks where the first row in every block is a mask row. The resulting structure is shown in FIG. 2. The priority encoding for the structure of FIG. 2 is strictly based on order and therefore adds to the demand of an efficient RAM handling for moving blocks of data when reconfiguring the look-up table.

As is shown in FIG. 2, the memory comprises a number of segments 8, each segment containing a mask row 6' at the top and underlying CAM rows. Each CAM row comprises a match field 5' and a data field 7' and preferably also a part containing optionally match or data 17. Thus, it is possible to have variable length match field and the mask 6' is adapted accordingly.

For practical reasons, all segments 8 have the same size, e.g. 16 rows, having one mask row and 15 CAM rows. However, the segments 8 could be customized to various sizes.

As is known in the art, each row of the memory contains cells which hold a match part to be compared with a mask and a data part in which is the stored useful data. The configuration of the sizes of the match and data parts is dynamically changeable which is useful for handling e.g. different types of address look-ups. It is especially useful if some part of the row may be configurable to hold either match bits or data bits as the match&data field 17.

Figure 3:
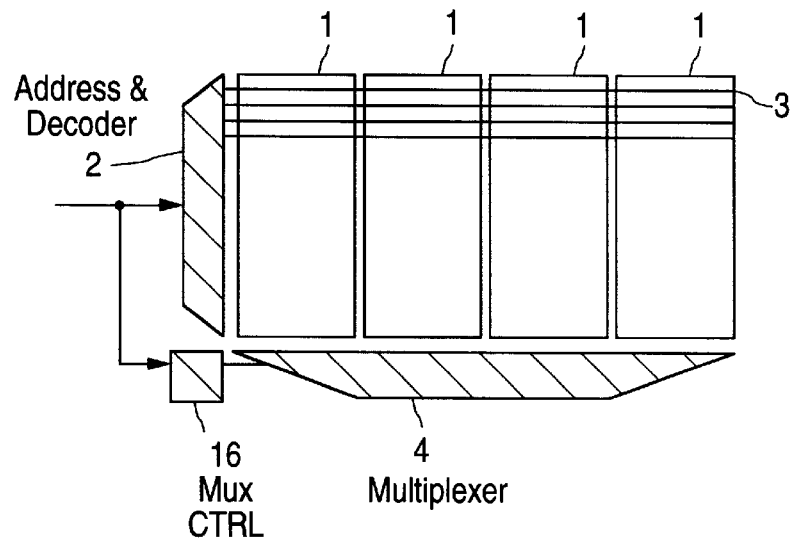
FIG. 3 is a diagram of the CAM/RAM block structure according to the invention.

As is described in the introduction of the specification, the form factor and size is important leading to the block structure as is shown in FIG. 3. The memory is partitioned into blocks 1 of e.g. 512 words. In the figures only four blocks 1 are shown but generally the device includes more parallel blocks to offer a complete memory space of e.g. 8 k words. An address decoder 2 is connected to all the memory rows of the blocks by means of word lines 3 of which only the top four are indicated. The address decoder 2 cooperates with a multiplexer 4 to enable reading and writing of the individual memory cells. The multiplexer 4 selects output data from a sense amplifier (not shown) from one selected memory block 1. The block selection is controlled by control logic 16 (mux CTRL) which is responsive to the kind of operation (RAM addressed read or CAM match operation read), some address bits, and prioritising between hits in different blocks 1. The control logic 16 receives commands from an operation line and match hit bus (not shown).

Figure 4:
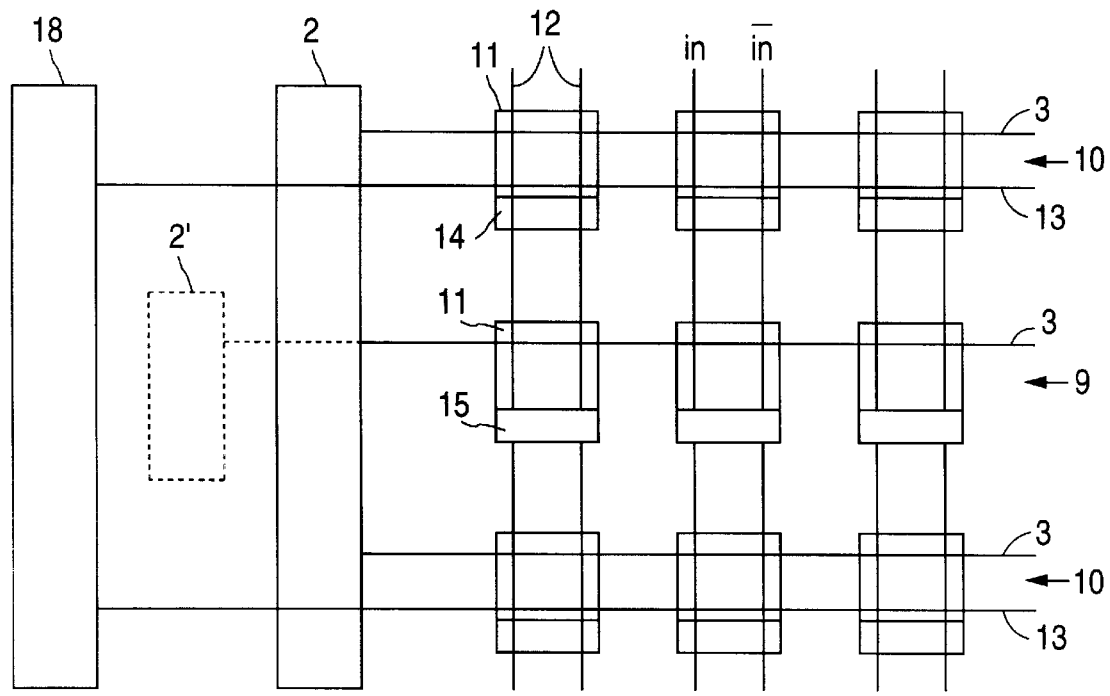
FIG. 4 is a diagram of a detail of a CAM memory including CAM rows and a mask row according to a first embodiment.

FIG. 4 shows a detail of a block of a CAM memory and shows the masked part of the rows including two CAM rows 10 and a mask row 9. The top CAM row is the bottom row of an overlying segment and the other CAM row is the first CAM row of the next segment under the mask row 9. All rows contain memory cells 11 which may be addressed through word lines 3 by the address decoder 2. The memory cells of the CAM rows 10 are each connected to a comparator 14. As is known in the art, match data is applied to the bit lines 12, two bit lines for each cell. If the match data is not masked, one bit line of the pair is the inverse of the other, and the comparator 14 compares the match data with the contents of the memory cell 11. If there is a hit, this is signalled on the match line 13 running through the row. On the other hand, if the match data is masked, both bit lines in the pair carry zeros resulting in a hit independent of the contents of the memory cell 11 ("don't care").

The mask row 9 also contains memory cells 11, in this case for storing a mask. Each memory cell of the mask row is connected to a mask unit 15 which performs the mask function. If the match data received by the pair of bit lines is to be masked, the mask unit 15 changes the match data to a pair of zeros. If the mask is not to be applied in the cell, the match data is propagated unchanged. As is known to a person skilled in the art, there are various ways to implement the function of the mask unit 15.

In the design shown in FIG. 4, the mask rows 9 (of which only one is shown), are connected in series. Hence, it will be appreciated that a mask row affects all underlying rows of the CAM memory block. Thus, the mask rows have to be arranged in a hierarchical order in accordance with the priority function mentioned below. This is not a great disadvantage because of the hierarchical nature of IP addresses where it is desired to obtain hits with the longest prefix match.

As an alternative to a common address decoder for all rows, it may be practical to use separate address decoders for CAM rows 10 and mask rows 9. A separate address decoder 2' for the mask rows 9 is outlined in FIG. 4. This increases the size a little but might in some cases simplify the use of the CAM memory.

Figure 5:
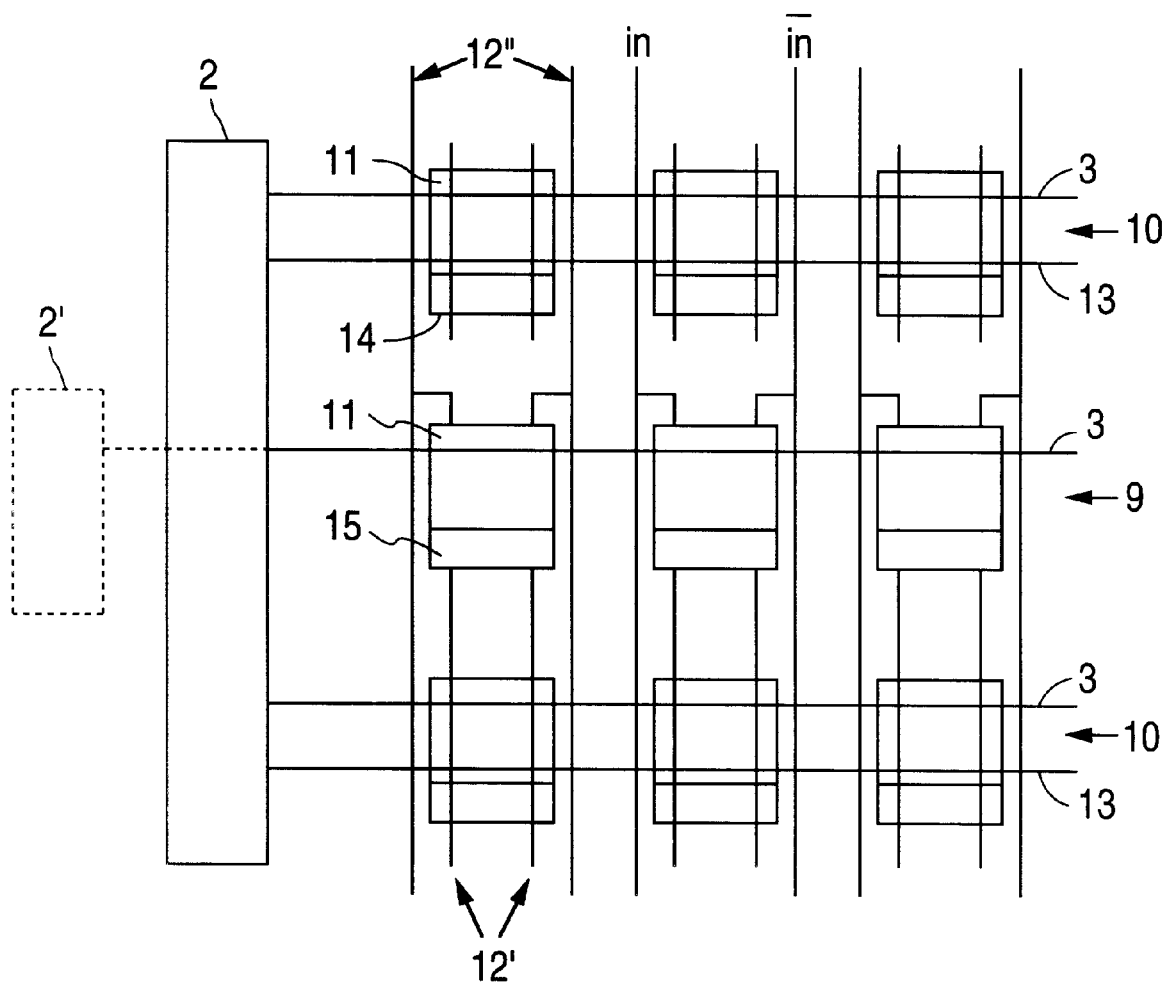
FIG. 5 is a diagram of a detail of a CAM memory including CAM rows and a mask row according to a second embodiment.

In FIG. 5, an alternative embodiment of the mask row arrangement with another design of the bit lines is shown. The same reference numerals are used for identical elements in FIGS. 4 and 5. In the alternative embodiment two levels of bit lines are provided. A first lower level comprises bit line pairs 12' connecting the mask row 9 (the top row) of each segment with its underlying CAM rows 10. A second higher level comprises a global bit line pair 12" running uninterrupted through all segments but only connected to the input to the top row of each segment, that is the mask row 9. These bit line pairs 12" connect the mask rows in parallel. The function is identical with the arrangement of FIG. 4, except that the match data is applied to the overlying bit line pairs 12", so that the match data is applied in parallel to all the mask rows and propagated through the bit line pairs 12' through all segments at the same time. Thus, the simpler structure of the serial bit lines 12 of FIG. 4 is traded against a faster search operation in the parallel structure of FIG. 5. Another advantage is that the mask rows do not have to be arranged in a hierarchical order, since the mask rows do not affect each other.

In a RAM addressed read mode, the address decoder 2, 2' and the multiplexer 4 cooperate to enable reading and writing by means of the word lines and bit lines. In a CAM mode, the masks 6' are applied to the bit lines thus forming match data lines running vertically through the memory blocks. There may be several hits in one and the same block 1. As is known in the art, a priority means 18, shown in FIG. 4 only, is connected to the match lines 13 for handling CAM matches and takes care of ensuring that only one match is generated in one block 1 of memory. In other words, the priority function selects one of the plurality of matches.

The mask arrangement according to the present invention thus makes it possible to implement the masking function and mask addressing of the memory device resulting in an efficient use of the available silicon area in a flexible way. A person skilled in the art will appreciate that the embodiment of the invention described in detail here may be varied as to form and sizes of the various parts. Terms such as vertical and horizontal are used only in a figurative sense and in relation to each other. The scope of the invention is only limited by the claims below.

What is claimed is:

1. A CAM/RAM memory device with a scalable structure, comprising:
   a memory having a number of rows of memory cells;
   at least one address decoder connected by word lines to the cells of the rows; and
   vertical bit lines for providing match data to implement CAM functionality of the memory device, wherein said rows include at least one mask row for providing a mask affecting the match data on the bit lines.

2. A memory device in accordance with claim 1, wherein the memory is divided into segments, each segment having a predetermined number of said rows and a mask row.

3. A memory device in accordance with claim 2, wherein the segments have the same size.

4. A memory device in accordance with claims 1, 2 or 3, wherein the address decoder is connected to all of the rows in said memory in order to control reading and writing of the memory cells.

5. A memory device in accordance with claims 1, 2, or 3, further including a separate address decoder connected to each said mask row for controlling reading and writing of the mask.

6. A memory device in accordance with claims 2 or 3, wherein said mask row is adapted to permit propagation of the match data on the bit lines or to permit said match data to be changed to "don't care" in accordance with the mask.

7. A memory device in accordance with claim 2, wherein said mask row in each of said segments is connected in series by said bit lines.

8. A memory device in accordance with claim 2 or 3, further including additional bit lines coupled only to said mask rows, and wherein in each segment the mask row and said predetermined number of rows are coupled to said vertical bit lines.

9. A memory device in accordance with claim 1, further including a multiplexer, wherein the memory is divided into parallel blocks, each said block having a plurality of rows of memory cells and wherein each row in a given block shares a word line with its corresponding row in the other of said blocks and said multiplexer is adapted to select said parallel blocks for reading data therefrom.

10. A memory device in accordance with claim 9, wherein a plurality of CAM matches may occur in a given block, said memory device further including priority means for selecting only one of said matches.

11. A memory device in accordance with claim 2, wherein said memory cells include match parts and data parts that are configureable so as to be dynamically changeable.

12. A memory device, comprising:
    a plurality of segments each having a CAM/RAM structure;
    said CAM/RAM structure including memory cells arranged in a predetermined plurality of rows, said memory cells in each row connected by word lines and arranged to form a plurality of columns;
    at least one address decoder coupled to said word lines; and
    a plurality of data lines coupling said memory cells in said columns and for applying match data to said CAM/RAM structures, wherein one of said rows in each of said segments is adapted to store a mask for masking said match data.

13. The memory device of claim 12, wherein each of said CAM/RAM structures includes a match field dynamically adaptable to a length of said mask.

14. The memory device of claim 13, wherein said mask is operable for masking said match data for said rows in each of said segments.

15. The memory device of claim 14, further including means for applying in parallel said match data to all of said mask rows.

* * * * *